United States Patent
Minton et al.

(10) Patent No.: US 7,180,947 B2
(45) Date of Patent: Feb. 20, 2007

(54) METHOD AND APPARATUS FOR A DYNAMIC DATA CORRECTION APPLIANCE

(75) Inventors: David H. Minton, Stanardsville, VA (US); Paul S. Fisher, Argyle, TX (US)

(73) Assignee: Planning Systems Incorporated, Reston, VA (US)

( * ) Notice: Subject to any disclaimer, the term of this patent is extended or adjusted under 35 U.S.C. 154(b) by 563 days.

(21) Appl. No.: 10/401,759

(22) Filed: Mar. 31, 2003

(65) Prior Publication Data

US 2004/0190627 A1 Sep. 30, 2004

(51) Int. Cl.
*H04B 1/66* (2006.01)
(52) U.S. Cl. .............................. 375/240.21; 375/240.18
(58) Field of Classification Search .............................. 375/240.01–240.29
See application file for complete search history.

(56) References Cited

U.S. PATENT DOCUMENTS

| | | | |
|---|---|---|---|
| 5,974,181 A * | 10/1999 | Prieto | 382/232 |
| 6,363,333 B1 * | 3/2002 | Deco et al. | 702/191 |
| 6,763,068 B2 * | 7/2004 | Oktem | 375/240.03 |
| 2003/0189980 A1 * | 10/2003 | Dvir et al. | 375/240.16 |
| 2004/0113933 A1 * | 6/2004 | Guler | 345/716 |
| 2005/0013369 A1 * | 1/2005 | Lee | 375/240.16 |

* cited by examiner

*Primary Examiner*—Andy Rao
(74) *Attorney, Agent, or Firm*—Kenyon & Kenyon LLP

(57) ABSTRACT

Embodiments of the present invention provide a method and system for a dynamic data correction appliance. A plurality of data points in a first domain may be sampled. The sampled data points may be transformed from the first domain to a second domain. The transformed data points may include a plurality of identified data points of interest in the second domain. Future data points may be predicted based on a forecast rule set and the plurality of data points of interest transformed to the second domain. The plurality of data points of interest transformed to the second domain may be compared with corresponding data points of interest included in the predicted future data points. An error measure based on the comparison may be calculated. It may be determined whether the error measure exceeds an error threshold. If the error measure exceeds the error threshold, a re-initialization process may be invoked.

24 Claims, 4 Drawing Sheets

METHOD AND APPARATUS FOR A DYNAMIC DATA CORRECTION APPLIANCE

TECHNICAL FIELD

The present invention relates to signal processing. In particular, embodiments of the present invention relate to systems and methods for efficient and/or noise free data processing.

BACKGROUND OF THE INVENTION

Data such as audio and/or video data may be captured or sampled at one location and may be transmitted to another location where it may be presented on a display and/or a through a speaker. For example, a surveillance camera may capture live video and transmit the live video to a display. The display may be located close to the camera or it may be located remote from the camera. In some cases, that captured data may be transmitted to another location via wired and/or wireless path such as a communications network.

Noise may be introduced in such input/output systems that may distort the output data and/or render the output data useless. Noise may be introduced at various stages to corrupt the data. For example, noise may be introduced when the data is captured or input, during transmission and/or when data is output.

Error encoding techniques may be used to reduce or eliminate noise, and/or safeguard the data from such noise in such input/output systems. Conventional means of error encoding may use an analytical solution, which may become data burdened. Other means of error encoding apply a statistical method that may not offer adequate sampling rates.

SUMMARY OF THE INVENTION

Embodiments of the present invention provide a method and system for a dynamic data correction appliance. A plurality of data points in a first domain may be sampled. The sampled data points may be transformed from the first domain to a second domain. The transformed data points may include a plurality of identified data points of interest in the second domain. Future data points may be predicted based on a forecast rule set and the plurality of data points of interest transformed to the second domain. The plurality of data points of interest transformed to the second domain may be compared with corresponding data points of interest included in the predicted future data points. An error measure based on the comparison may be calculated. It may be determined whether the error measure exceeds an error threshold. If the error measure exceeds the error threshold, a re-initialization process may be invoked.

BRIEF DESCRIPTION OF THE DRAWINGS

Embodiments of the present invention are illustrated by way of example, and not limitation, in the accompanying figures in which like references denote similar elements, and in which.

DETAILED DESCRIPTION

Embodiments of the present invention provide a method and apparatus for error encoding that may find application in a data processing system or the like. Embodiments of the present invention provide a dynamic error encoding apparatus and method that may be acceptable, efficient and/or highly reliable.

Figure 1:
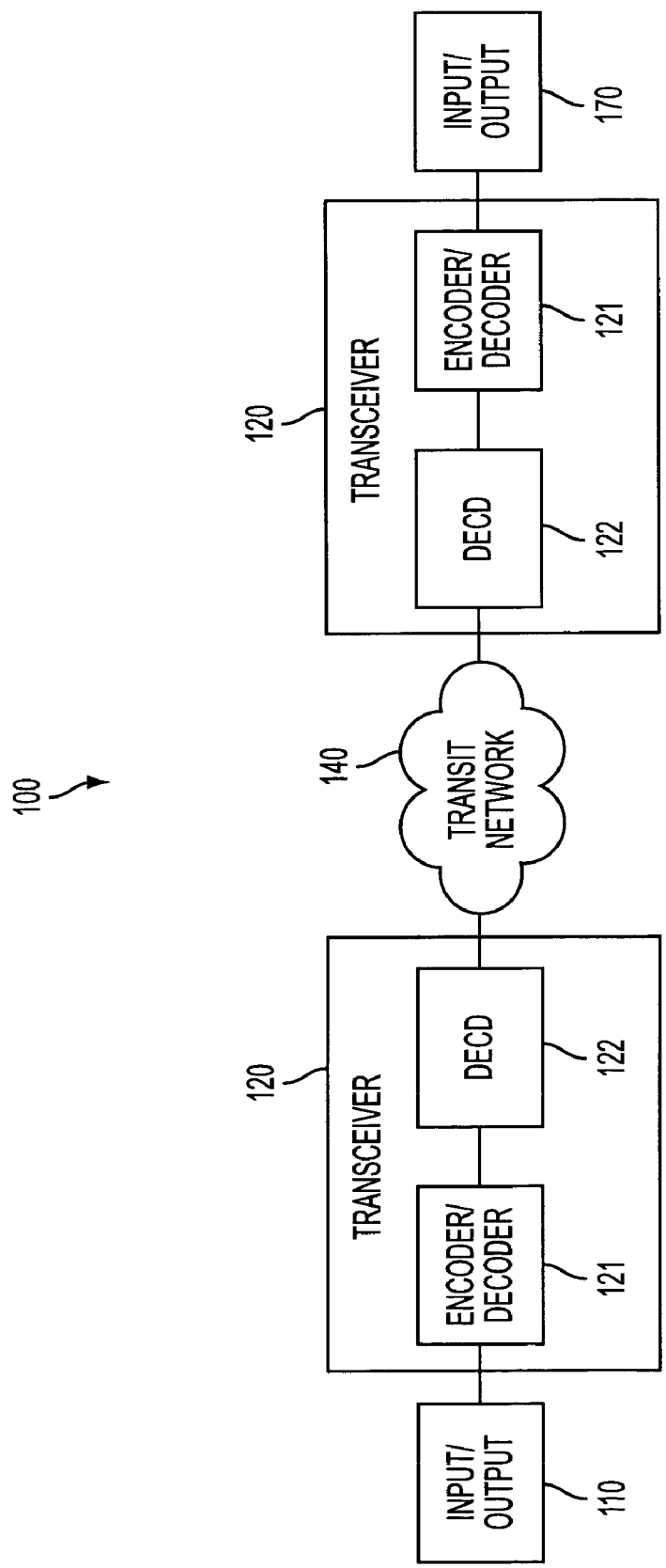
FIG. 1 is a block diagram of a system in accordance with an embodiment of the present invention.

FIG. 1 is an exemplary block diagram of a system 100 in which embodiments of the present invention may find application. As shown in FIG. 1, an input/output (I/O) device 110 may be coupled to a transceiver (e.g., transmitter/receiver) 120 that may communicate over network 140 to I/O device 170. I/O device may communicate over network 140 via another transceiver 120.

In embodiments of the present invention, terminal devices 110, 170 can be any of a variety of devices that can generate, store and/or output audio/video data. For example, terminal devices 110, 170 may be Personal Digital Assistants (PDAs), personal computers (PCs), or any other devices that be used to input and/or output audio/video data. In an embodiment of the present invention, the terminal device can include a camera and/or microphone to receive input data and or may further include a display and/or speaker to output the data, for example. In embodiments of the present invention terminal device 110 may include additional sensor and/or display devices that may include thermal, seismic, audio, infrared, as well as other sensor and/or display systems, and or any combination thereof. In embodiments of the present invention, I/O 110, 170 may be a communications device such as wired and/or wireless telephone or other communications device.

In embodiments of the present invention, I/O devices 110, 170 may be coupled to transceivers 120 that transmit and/or receive data to and/or from the I/O devices. It is recognized that the transceivers may be located internal to and/or external to the I/O devices 110, 170.

In embodiments of the present invention, transceivers 120 may include, for example, an encoder/decoder 121 and/or a dynamic error coding device (DECD) 122. Transceiver 120 may include additional hardware and/or software components that not shown for simplicity. It is recognized that the transceiver 120 coupled to the I/O device 110 may be configured same as or may be configured different from the transceiver 120 coupled to the I/O 170.

In embodiments of the present invention, encoder/decoder 121 may be any conventional encoder/decoder known in the art. The DECD 122 is described below in more detail.

It is recognized that embodiments of the invention may include, for example, other components such as processors, computer readable memories, data ports or other interfaces, network ports or other interfaces, data buses and/or other hardware and/or software components (all not shown). The data ports or other interfaces may permit the various devices to communicate with other devices and/or with the transit network 140. The data buses may connect the processor, the computer readable memory, the data port or other interface and/or the network port or other interface and may permit communications between the various components in embodiments of the invention.

Transit network 140 may be a communications network that may include, for example, a public switched telephone network (PSTN), an Integrated Services Digital Network (ISDN), a cellular network, a digital mobile network, a Personal Communication Systems (PCS) network, an Internet, an intranet, a signaling system 7 (SS7) network, a local area network (LAN), a satellite network, an advance intelligent network (AIN), any suitable digital or analog network, a broadband network such as a cable network, any other suitable national and/or international communications network or any suitable combination thereof.

In embodiments of the present invention, the transit network 140 may include a plurality of switches, communication interfaces, and/or other components that are not shown for convenience. It is recognized that the communications that may be provided may include hard-line, wireless, RF, optical, or any other type of communications or any combination thereof. The various devices, systems, networks, etc. may be appropriately configured or equipped with hardware and/or software to operate in such environments.

Figure 2:
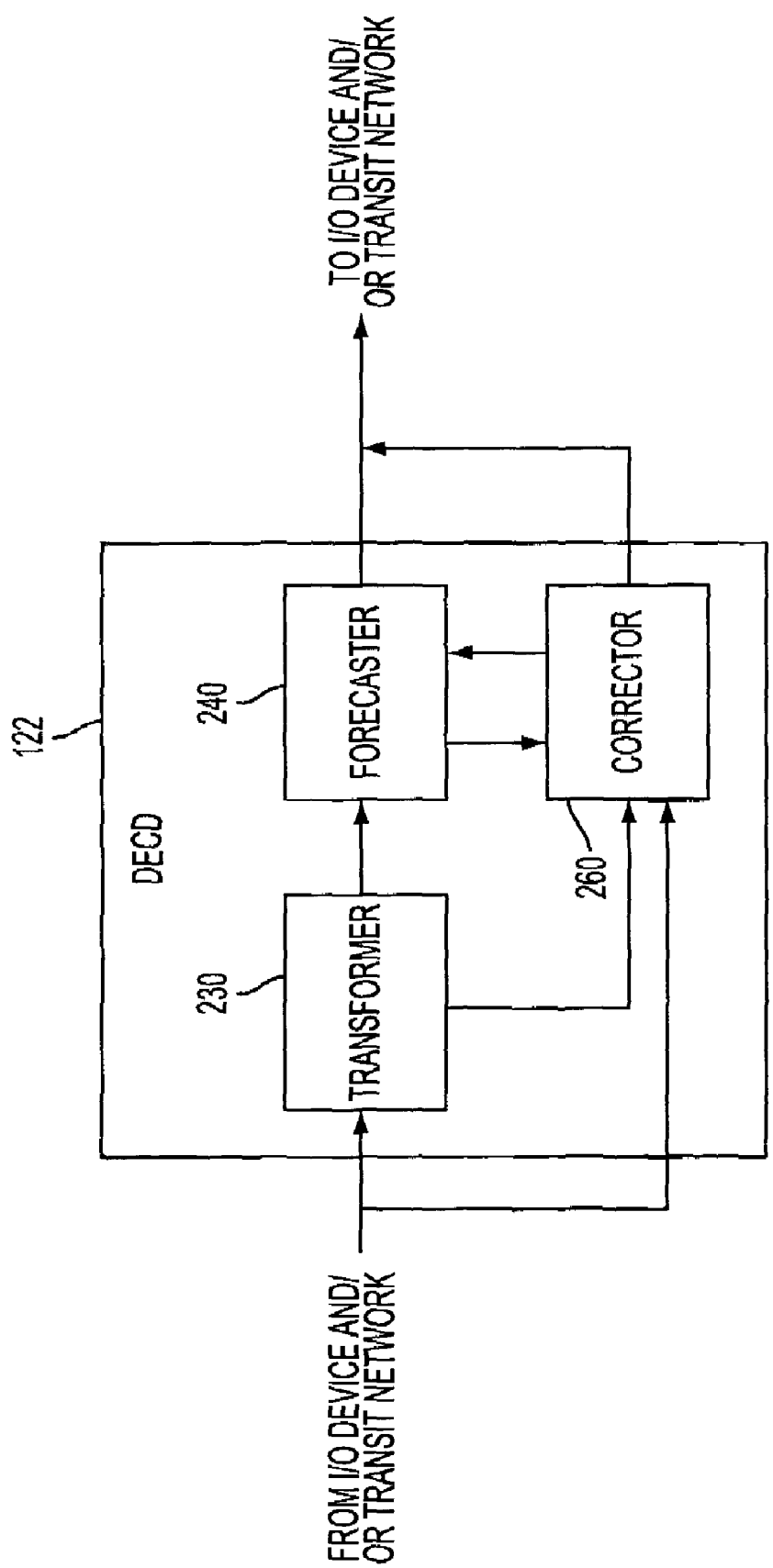
FIG. 2 illustrates a block diagram of an dynamic error correction device in accordance with an embodiment of the present invention.

FIG. 2 shows an embodiment of the DECD 122 of the present invention. DECD 122 may include a transformer 230, forecaster 240, and/or corrector 260.

in embodiments of the present invention, input or raw data may be input to a transceiver 110 by a user operating the input output device 110. The input or raw data may be, for example, the first frame of an audio/video movie captured or sampled by I/O device 110. In this example, the I/O device 110 may include a camera to capture the video movie. It is recognized that the input data may be any type of data such as data in any computer readable form and/or format.

The input data may be compressed and/or otherwise processed at encoder 121. The processed input data may be output by transceiver 120 coupled to the I/O device 110. In this example, the processed data may be output to an I/O device, to transmit network 140 and/or any other communication media such as a cable and/or any combination thereof.

In one example, the processed input data may be received at transceiver 120 coupled to I/O device 170. The processed input data may be decompressed and/or otherwise processed at the transceiver 120. The transceiver 120 may forward the data to the I/O device 170. The I/O device 170 may output the input data via, for example, a display and/or speaker (not shown). In this example, the input data may represent a first frame or frames of a video clip and thus, the first frame or frames may be output via the I/O device 170.

In embodiments of the present invention, if the DECD 122 is in operation, the transformer 230, in the transceiver coupled to 110 110, may transform the input data from a first domain to a second domain. For example, the transformer may apply a wavelet transform to convert input data into a compressed data domain. In embodiments of the present invention, it is recognized that the transformer may apply a null transform to transform the input data from a first domain to a second domain. As indicated above, the input data may be, for example, data included in a video and/or audio data frame.

It is recognized that the transformer may apply any number of techniques to compress the input data. Such methods may include lossless compression methods and/or lossy compression methods. Lossless methods include, for example, Run Length Encoding (RLZ), Lempel-Ziv encoding (LZ), Virtubi encoding, Manchester Encoding and Huffman Encoding. Lossy compression methods include, for example, Affine encoding, empirical orthogonal function (EOF), Discrete Cosine Transform (DCT), Fourier Transform, Vector Quantization (VQ) and Wavelet Transform. It is recognized that other compression methods may be used in accordance with embodiments of the present invention.

In embodiments of the present invention the input data may be compressed using uniform compression methods and/or may be compressed using non-uniform methods yielding variable compression over the input and/or the input data may be compressed sequentially and/or in parallel. For example, using non-uniform methods, selected domains of the input data may be compressed using a higher compression rate (e.g. low resolution) and the other domains may be compressed using a lower compression rate (e.g. high resolution). It is recognized that the domains of data may be selected by boxing-in or banding-in the desired areas, domains and/or data of interest. Of course, any known selection methods may be used to select different domains of the input data that need to be compressed.

In embodiments of the present invention, the forecaster 240 may apply, for example, a non-linear Markov like method such as finite inductive sequences (FIS) to predict the future state of the data. As is known, FIS may assume that the occurrence of a bit of information such as a pixel in an image has a specific relationship with information that proceeded it such as previous pixels. The previous sample set (e.g., which preceded the data) can be large, small, simple, and/or complex. Association between data may be based on cellular automata. For example, cellular automata may be applied to predict the future state of the data given the previous state or chaotic nature of the data. It is recognized that any technique and/or techniques may be used to predict the future state of the data.

In an exemplary embodiment of the present invention, FIS may be applied as a technique for data indexing and sorting which may provide rapid access to the specifics of the Shannon entropy in the overall data domain. For example, FIS can permit focus on the information that is of most interest and scale the rest of the information to domains of lesser interest. In embodiments of the present invention, a user may select the data domain that is of more interest, the data domain of interest can be dynamically generated and/or hard coded into the system, and/or any combination thereof. The data domain of interest may contain the data that is more important or relevant as compared to the remainder of the image. The data domain of interest may be automatically identified based on, for example, pre-set parameters. In embodiments of the present invention, the pre-set or pre-determined parameters may be stored as a library or features of interest and/or by some other technique.

In embodiments of the present invention, the forecasted data may be output by the forecaster 240 to an I/O device and/or to the transit network. The corrector 260 may receive the transformed data from transformer 230 as well as the future state of the data (e.g., predicted data) from forecaster 240. In embodiments, the forecaster 240 may apply a rule set to forecast the future state of the data. The forecaster may determine future data for all of the data and/or a domain of the data such as the data domain of interest. In embodiments of the present invention, the forecaster 240 may make the forecast based on previous forecast information or methods such as embodied in a traditional algorithm and/or by cellular automata. The forecaster 240 may also be able to adapt dynamically for circumstances in which a priori information is inadequate and/or incomplete.

In embodiments of the present invention, the corrector 260 may compare, for example, the plurality of data domains of interest with the corresponding data domains included in the predicted data forecasted by the forecaster 240 of DECD 122. The corrector 260 may calculate an error measure based on this comparison. The error measure may indicate the difference between the actual identified data domains of interest and the corresponding data domains that were predicted by the forecaster 240.

The corrector 260 may compare the error measure with an error threshold to determine if the predicted data is within acceptable limits. If the predicted data is within acceptable limits which may have been previously established or may be dynamically established, the corrector 260 may notify the forecaster 240. The forecaster 240 may output the predicted data.

In embodiments of the present invention, the corrector 260 may make the comparison between the error measure and/the the error threshold at an appropriate rate, and may re-initialize the forecaster 240 when needed. For example, the corrector 260 may re-initialize the forecaster 240 every 60 or 90 frames for real time video. For real time audio, re-initialization may occur more frequently. It is recognized that the corrector 260 may re-initialize the forecaster whenever necessary. This may be done periodically and/or done dynamically.

For example, if the error measure exceeds the error threshold, the corrector 260 may invoke a re-initialization process to re-initialize the forecaster. During the re-initialization process, the forecaster 240 may discard the predicted data based on the previous frame or frames (e.g., the first frame or first set of frames) and may generate predicted data based on the current frame or frames. The forecaster 240 apply a rule set to forecast the future state of the data based on the current frame or frames. The forecaster may determine future data for all of the data and/or a portion or domain of the data such as the data of interest. The rule set may be the same as the rule set described above or it may be a different from the earlier rule set.

In embodiments of the present invention, the predicted data may be output to an I/O device, to transmit network 140 and/or any other communication media such as a cable and/or any combination thereof. In this example, the predicted data may be sent to transceiver 120 coupled to I/O device 170. The predicted data may be received by the transformer 230 and transformed back to the first domain.

In an embodiment of the present invention, the transceiver 120 may utilize the predicted data to generate a next data frame or frames. For example, the transceiver 120 may combine the data of the previous frame or frames (e.g., the first frame or first set of frames) with the predicted frame or frames to generate the next frame or frames. The transceiver 120 may replace the data in, for example, the first frame or frames with corresponding data included in the predicted data to generate the next frame or frames. The next frame or frames may be sent to I/O device 170 for output via a display and/or speaker.

In embodiments of the present invention, the corrector 260 may check the predicted data to confirm that the data is within acceptable limits. For example, the corrector 260 may compare predicted data with corresponding data from the previous data received (e.g., the first frame or first set of frames). Based on this comparison, the corrector may determine if the difference is within an acceptable limit. If the difference is within an acceptable limit, the transceiver 120 may combine the data of the previous frame (e.g., first frame or first set of frames) with the predicted frame or frames to generate the next frame or frames, as described above.

In embodiments of the present invention, the forecaster 240 may continue to generate future data based on the previous data. It is recognized that the previous data may be previously predicted data and/or may be original data retrieved from a current data frame or frames.

Figure 3:
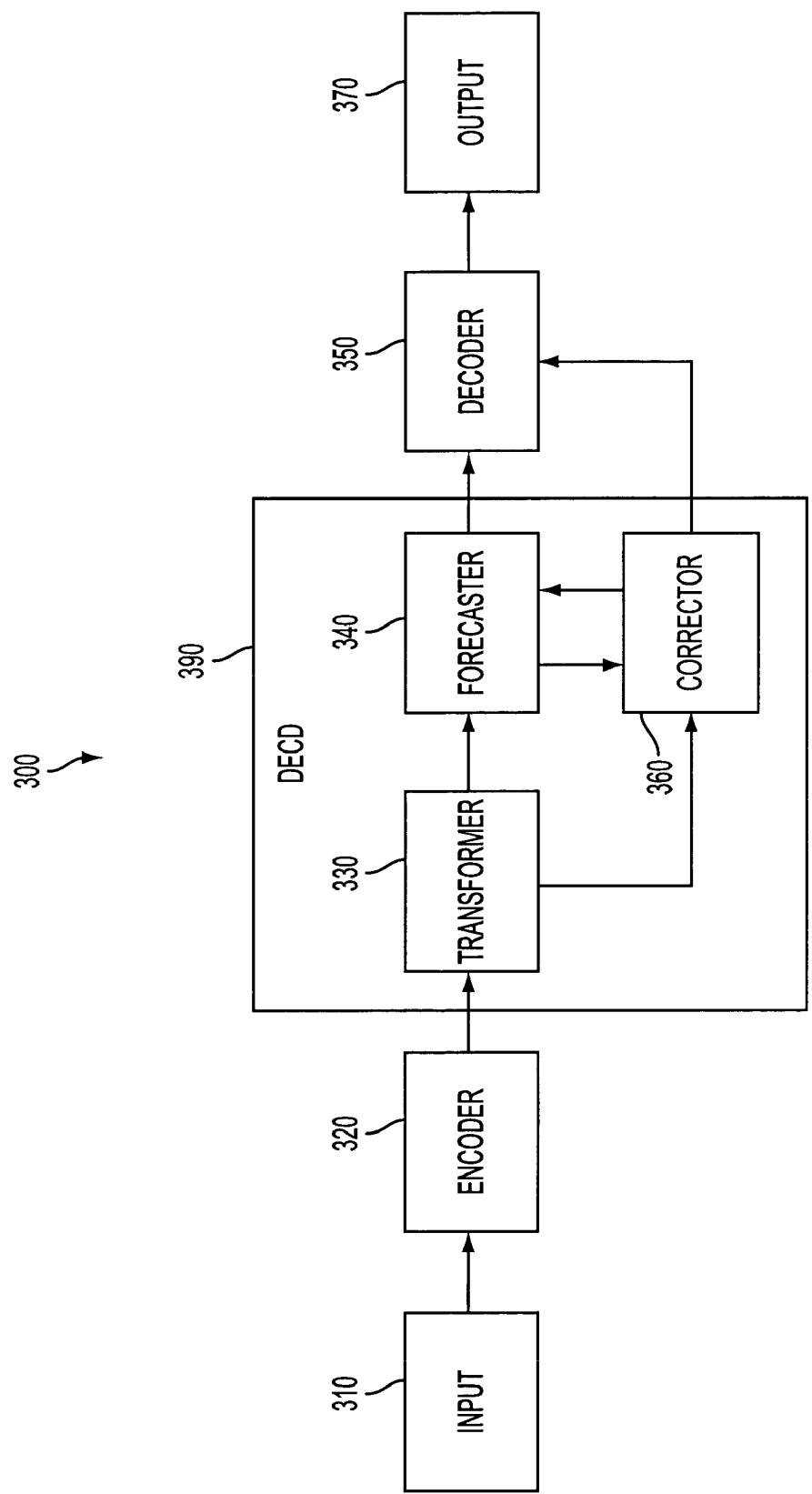
FIG. 3 is a block diagram of a system in accordance with another exemplary embodiment of the present invention.
Figure 4:
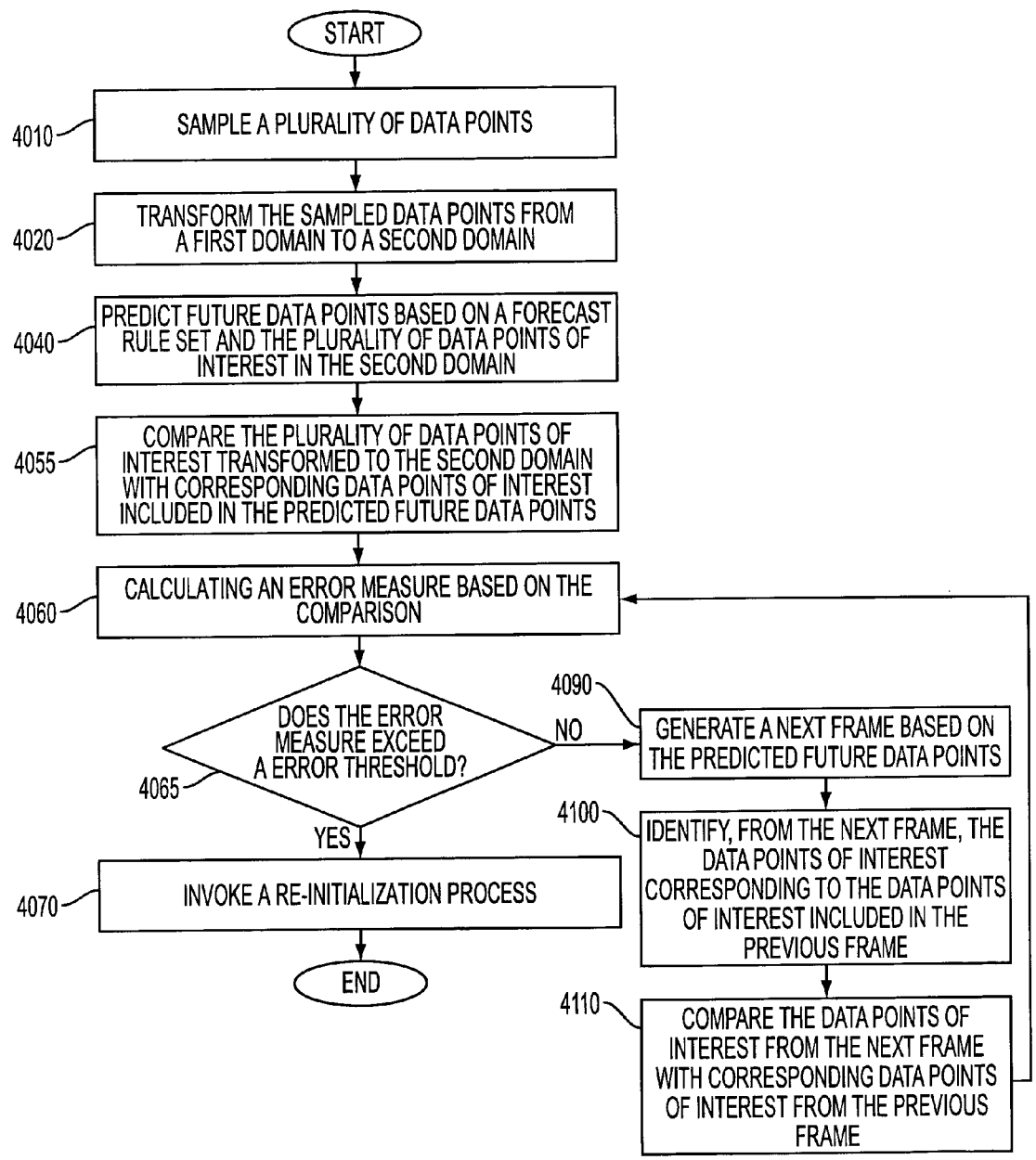
FIG. 4 is flowchart in accordance with an exemplary embodiment of the present invention.

FIG. 4 is a flowchart illustrating a method in accordance with embodiments of the present invention. The method of FIG. 4 is described with reference to the block diagram of FIG. 3. FIG. 3 is a block diagram of an embodiment of the present invention.

FIG. 3 shows an input device 310 coupled to an encoder 320 that is coupled to dynamic error coding device (DECD) 390. DECD 390 may be coupled to decoder 350 coupled to an output device 370. In this example, the output from DECD 390 may be presented via output device 370. It is recognized that the various components shown in the figures may be coupled using any type of wired and/or wireless means. The encoder 320, DECD 390 and/or decoder 350 may be incorporated within the input device 310 and/or output device 370.

In embodiments of the present invention, the input device 310 may be, for example, a video camera that may incorporate a microphone to capture both audio and/or video data. The device 310 may capture a plurality of audio/video data frames including a plurality of data domains or data points. The captured data points may be sampled at encoder 320, as shown in 4010. The sampled data may represent a first frame or a plurality of frames including audio and/or video data.

In this example, the first frame or plurality of frames of audio and/or video data may be output via output device 370. In this case, the output device 370 may include a display to output video data, and/or may include a speaker to output audio data.

The DECD 390 may process, for example, the first frame or frames of the data in accordance with embodiments of the present invention. The data may be input in digitized form to the DECD 390. The transformer 330 in the DECD 390 may transform the sampled data from a first domain to second domain, as shown in 4020. For example, the transformer 330 may compress the input data using a wavelet or other transform.

In embodiments of the present invention, a plurality of data points of interest in the first domain may be identified. A user of the system may manually identify the points of interest and/or the points of interest may be identified automatically based on predetermined parameters, for example. The data domains of interest may represent points that may be more relevant as compared to the other data points included in the frame. For example, in a picture or video image of a group of people, the user may select, using known technique, the individual or individuals and/or a section of the picture or image that is of particular interest to the user. The user may make such a selection using the display of output device 370 and an input interface such as a mouse, touch screen, key board, etc.

Data points representing the selected area of the picture, image or data frame may be used for further processing, in accordance with embodiments of the invention. The identified points of interest may be identified in the first domain and transformed from the first domain to the second domain. As indicated above, the second domain may be a compressed domain and thus, the points of interest may be moved into the compressed domain. Thus, the transformed data points may include a plurality of data points of interest in the second domain.

As shown in 4040, the forecaster 340 may predict future data points based on a forecast rule set and the plurality of data points of interest in the second domain. In embodiments of the present invention, the forecaster may extrapolate the behavior of the data based on, for example, Shannon entropy of interest. The plurality of data points of interest transformed to the second domain may be compared with corresponding data points included in the predicted future data points, as shown in 4055. Based on this comparison, an error measure may be calculated, as shown in 4060. If the error measure exceeds a error threshold, the corrector 360 may invoke a re-initialization process, as shown in 4065 and 4070.

In embodiments of the present invention, it is recognized that the corrector may invoke the re-initialization process based on a pre-determined number of frames. For example, the re-initialization process may be initiated every 30, 60, 90 or after any number of frames that are processed by the system 300.

In embodiments of the present invention, the re-initialization process may include retrieving current data from the input device 310, for example, and processing the current data to forecast and/or predict future data points.

In embodiments of the present invention, if the error measure does not exceed the error threshold, a next frame may be generated based on the predicted future data points, as shown in 4065 and 4090. The next frame may be output via output device 370.

The DECD 390 may continue to generate future data in accordance with embodiments of the present invention. For example, the forecaster 340 may use the predicted future data points and a forecast rule set to generate the next frame or frames. The data points of interest from the next frame or frames, corresponding to the data points of interest included in the previous frame, may be identified and/or compared to each other, as shown in 4100 and 4110. An error measure based on this comparison may be calculated and compared with an error threshold, as shown in 4060 and 4065.

In embodiments of the present invention, if the error measure exceeds the error threshold, then the re-initialization process may be invoked, as shown in 4070. If the error measure does not exceed the error threshold, then the forecaster may continue to predict data and generate another frame or set of frames from the predicted data. These generated frames may be shown on a display that may be included in output device 370.

In embodiments of the present invention, data frames may be generated based on previously forecasted data until re-initialization is invoked. Re-initialization may be invoked if a calculated error measure exceeds an error threshold and/or until a pre-determined number of frames are generated.

In embodiments of the present invention, a wavelet transformation may be used because such a transformation is infinitely scalable and may permit sampling of the data in the domain of interest at high rates while in the domain of non-interest, at an arbitrarily low rate. Curve fitting corrections may be applied automatically and/or dynamically as the data changes.

Embodiments of the present invention may be employed in many areas such as video noise reduction, link error correction, navigation, etc.

For example, embodiments of the present invention may be applied to video recording device and media limitations to reduce noise. These devices include a camera or sensor, and the media may include magnetic, optical, and other storage devices.

In navigation, embodiments of the present invention may be applied based on specific navigation needs such as of precision, accuracy, drift, weight, cube, power, etc. Embodiments of the invention may be applied either in whole or in part to replace all or some components of global positioning system (GPS) or inertial navigation system (INS) devices. For GPS devices, for example, embodiments of the invention may replace the Kalman Filter and reduce the acceleration vulnerabilities or dependencies on the GPS constellation that are encountered in such systems. For INS devices, for example, embodiments of the invention may replace all or some of the gyro functions.

Embodiments of the present invention may find applications in, for example, crowd dynamics modeling. Embodiments of the present invention may be applied based on specific decision support and/or training needs regarding the use of both lethal and/or non-lethal weapons and their impact on the dynamics of a crowd, for example. Embodiments of the invention may be applied either in whole and/or in part to providing a method for anticipating, thresholding, and/or otherwise discriminating the probable, possible, and/or likely behavior of a crowd in a given area and/or region in response to various crowd control techniques such as weapons, weapons systems, and/or systems components. These weapon system or system components may include, for example, noise weapons, light weapons, non-lethal munitions in conventional weapons, directed energy weapons, or components such as stand-off distances or barrier devices. When embodied as a tool for this type of implementation, the present invention may act as a planning, analysis, training, and/or situational awareness tool.

For example, in embodiments of the invention applied to, for example, crowd dynamics, a discrete pixel and/or a plurality of pixels in the image domain may be used to represent individuals and/or groups of individuals. The behavior of the crowd in response to crowd control techniques may be modeled using embodiments of the present invention. The crowd control techniques may include, for example, the use of water, tear gas, noise, light, and/or other weapon and/or any other crowd control technique. As indicated above, such models may be used for a planning, analysis, training, and/or situational awareness purposes.

In embodiments of the present invention, for example, byte array values assigned to each pixel and/or a group of pixels may be used to correspond to individual characteristics which may affect crowd behavior. For example, byte values can be used to assign gender, age, religious or political preferences as well as assigning Newtonian characteristics, such as mobility, temperament (e.g., angry, hostile, friendly, etc.) and/or other characteristics of individuals in the crowd being modeled. Additionally, byte values may be used to assign noise, slogan, mantra and/or historical tendencies. For example, noise may be used to represent a particular crowd control technique.

Models, in accordance with embodiments of the present invention, may be used, for example, to anticipate how a crowd based on, for example, characteristics of individuals in the crowd, characteristics of the crowd as a whole and/or characteristics of the crowd control technique may behave and/or react to the particular crowd control technique. Thus, results, based on such models developed using embodiments of the present invention, may assist authorities in determining which crowd control techniques would be most effective and/or should be used when confronting a particular type of crowd and/or situation in reality.

It is recognized, that real time data may be used, in accordance with embodiments of the preset invention, to anticipate crowd behavior related to a current situation so that appropriate action may be taken and/or contingencies may be planned for proper, efficient, and/or safe crowd control. It is recognized that based no a particular crowd's characteristics and/or individual's characteristics in the models generated, crowds and/or individuals that may display suspicious and/or dangerous characteristics may be identified and/or may be handled appropriately.

Embodiments of the present invention may find application in, for example, computer network dynamics modeling. Embodiments of the present invention may be applied based on specific criteria which may be of interest to the health, well being and/or security of a computer and/or the computer network. The modeling might include thresholds and/or iterations of events at the processor such as the central processor unit (CPU), other components of the computer system and/or at the operating system level which represent transactions that might damage, inhibit, slow down, misdirect, and/or otherwise confound the network. When embodied as a tool for this type of implementation, the present invention may act as an intrusion detector or barrier for the network and may be combined with existing biometrics and/or other authentication services and/or devices to isolate and/or identify an intruder, for example.

For example, in accordance with embodiments of the of the present invention, a network device, discreet nodes in the network, such as computers, servers, clients, gateways, guards, interfaces, firewalls, routers and switches, and other devices or components may be represented as pixels in the image domain. These pixels may then have values assigned through the byte array which makes up the image which correspond to the transactions available or the behaviors available for that process and which may then represent behaviors in the network which correspond to abuse of resources. Thus, such models may be used to identify, address and/or repair problems prior to actual failure.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A method comprising:
   sampling a plurality of data points in a first domain;
   transforming the sampled data points from the first domain to a second domain, wherein the transformed data points include a plurality of identified data points of interest in the second domain;
   predicting future data points based on a forecast rule set and the plurality of data points of interest transformed to the second domain;
   comparing the plurality of data points of interest transformed to the second domain with corresponding data points of interest included in the predicted future data points;
   calculating an error measure based on the comparison;
   determining if the error measure exceeds an error threshold; and
   if the error measure exceeds the error threshold, invoking a re-initialization process;
   wherein the sampled data points in the first domain are included in a first data frame, the method further comprising:
   if the error measure does not exceed the threshold, generating a next frame basd on the predicted future data points.

2. The method of claim 1, wherein generating the net frame comprises:
   transforming the predicted future data points from the second domain to the first domain.

3. The method of claim 2, further comprising: displaying the next frame.

4. The method of claim 2, further comprising:
   identifying, from the next frame, data points of interest corresponding to the data points of interest included in a previous frame;
   comparing the data points of interest from the next frame with corresponding data points of interest from the previous frame; and
   calculating a corresponding error measure based on the comparison.

5. The method of claim 4, further comprising:
   if the corresponding error measure exceeds the error threshold, retrieving current data; and
   generating a next predicted frame based on the current data and a corresponding previous frame.

6. The method of claim 1, wherein the invoking the re-initialization process comprises:
   sampling current data points included in a current data frame;
   transforming the current data points from the first domain to the second domain, wherein the transformed current data points include a plurality of current data points of interest in the second domain; and
   predicting future data points based on the forecast rule set and the plurality of current data points of interest transformed to the second domain.

7. The method of claim 1, wherein the sampled data points in the first domain are included in a first data frame and invoking the re-initialization process comprises:
   sampling current data points; and
   determining a correction factor based on the recently acquired data points and corresponding predicted future data points.

8. The method of claim 7, further comprising:
   transmitting the correction factor if the error measure exceeds the error threshold.

9. The method of claim 7, further comprising:
   applying the correction factor to the corresponding predicted future points to generate a plurality of corrected data points.

10. The method of claim 1, wherein the data points include audio data.

11. The method of claim 1, wherein the data points include video data.

12. The method of claim 1, wherein the data is transformed to the second domain using a wavelet transform.

13. The method of claim 1, wherein the data is transformed to the second domain using a fourier transform.

14. The method of claim 1, wherein the data is transformed to the second domain using vector quantization.

15. The method of claim 1, wherein the second domain is a compressed domain.

16. The method of claim 1, wherein the future points are predicted using a non-linear Markov method.

17. The method of claim 16, wherein the future points are predicted using a finite inductive sequence.

18. The method of claim 1, wherein the future points are predicted using cellular automata.

19. A machine-readable medium having stored thereon a plurality of executable instructions to be executed by a processor to implement a method for data processing, the method comprising:
   sampling a plurality of data points in a first domain;
   transforming the sampled data points from the first domain to a second domain, wherein the transformed data points include a plurality of identified data points of interest in the second domain;

predicting future data points based on a forecast rule set and the plurality of data points of interest transformed to the second domain;

comparing the plurality of data points of interest transformed to the second domain with corresponding data points of interest included in the predicted future data points;

calculating an error measure based on the comparison;

determining if the error measure exceeds an error threshold; and if the error measure exceeds the error threshold, invoking a re-initialization process;

if the error measure does not exceed the threshold, generating a next frame based on the predicted future data points, wherein the sampled data points in the first domain are included in a first data frame.

20. The machine-readable medium of claim 19, the method further comprises:

transforming the predicted future data points from the second domain to the first domain.

21. The machine-readable medium of claim 20, the method further comprises:

displaying the next frame.

22. The machine-readable medium of claim 19, the method further comprises:

identifying, from the next frame, data points of interest corresponding to the data points of interest included in a previous frame;

comparing the data points of interest from the next frame with corresponding data points of interest from the previous frame; and calculating a corresponding error measure based on the comparison.

23. The machine-readable medium of claim 22, the method further comprises:

if the corresponding error measure exceeds the error threshold, retrieving current data; and generating a next predicted frame based on the current data and a corresponding previous frame.

24. The machine-readable medium of claim 19, the method further comprises:

sampling current data points included in a current data frame;

transforming the current data points from the first domain to the second domain, wherein the transformed current data points include a plurality of current data points of interest in the second domain; and predicting future data points based on the forecast rule set and the plurality of current data points of interest transformed to the second domain.

* * * * *